United States Patent [19]
Koch

[11] Patent Number: 5,119,400
[45] Date of Patent: Jun. 2, 1992

[54] DIGITAL TRANSMISSION SYSTEM EMPLOYING A VITERBI-LIKE EQUALIZER

[75] Inventor: Wolfgang Koch, Heroldsberg, Fed. Rep. of Germany

[73] Assignee: U. S. Philips Corporation, New York, N.Y.

[21] Appl. No.: 508,031

[22] Filed: Apr. 11, 1990

[30] Foreign Application Priority Data

Apr. 12, 1989 [DE] Fed. Rep. of Germany ....... 3911999

[51] Int. Cl.$^5$ .............................................. H04B 3/04
[52] U.S. Cl. ..................................... 375/12; 371/43; 375/13; 375/101
[58] Field of Search ...................... 371/6, 37.8, 43, 44; 375/13, 14, 34, 94, 99, 101, 103, 12; 341/106

[56] References Cited

U.S. PATENT DOCUMENTS

| | | | |
|---|---|---|---|
| 4,456,992 | 6/1984 | Schaub | 371/6 |
| 4,823,346 | 4/1989 | Kobayashi | 371/43 |
| 4,914,660 | 4/1990 | Hirose | 371/37.8 |

FOREIGN PATENT DOCUMENTS 0152947 8/1985 European Pat. Off.
0294116 12/1988 European Pat. Off.

OTHER PUBLICATIONS

G. D. Forney, Jr., "The Viterbi Algorithm", Proceedings of the IEEE, vol. 61, No. 3, Mar. 1973, pp. 268-278.

Primary Examiner—Benedict V. Safourek
Attorney, Agent, or Firm—David R. Treacy

[57] ABSTRACT

In a digital transmission system having a dispersive transmission channel, so-called Soft Decision Decoding of the data elements is carried out utilizing reliability information which is a probability function indicating with what probability the data elements correspond with the transmitted data elements. This reliability information is generated by means of Viterbi-like equalizer in that respectively from first and second mutually exclusive sets of all possible paths along transitions between multibit states, corresponding to sequential bit values, the first set characterized by the n last bit value being binary "zero" and the second set characterized by the n last bit value being binary "one", the paths having the smallest probability function are selected and the reliability information is produced from the ratio between the probability functions of the paths selected from the respective sets.

9 Claims, 4 Drawing Sheets

DIGITAL TRANSMISSION SYSTEM EMPLOYING A VITERBI-LIKE EQUALIZER

BACKGROUND OF THE INVENTION

1. Field of the Invention

The invention relates to a digital transmission system comprising an equalizer for producing binary estimates from a sequence of sample values of a signal, to which estimates can be assigned binary values "zero" or "one" of issued bits (binary digits). Each sample value depends on the bit that can be assigned thereto and on n bits immediately preceding this bit, in that $2^n$ states are assigned to each sample value and a probability function is assigned to the probability of the transition from one state to a following state and paths are formed by stringing together state transitions, an overall probability function being produced from all the probability functions of a path, and from all the paths leading to a state only the path having the minimum overall probability function is being considered.

2. Description of the Related Art

In digital transmission systems comprising dispersive transmission channels a signal coming from the transmitter and containing the information to be transmitted in the form of bits is distorted as a result of delay differences and phase shifts when passing through the transmission channel. These distortions cause the bits contained in the received signal to be influenced by preceding bits (intersymbol interference).

Dispersive transmission channels are found both in radio transmission systems and in cable transmission systems. Delay differences and phase shifts occur, for example, as a result of reflections and, in radio transmission systems, as a result of multipath propagation. Especially in radio transmission systems, in which send and receive stations are mobile, for example, in a car telephone system, these distortions additionally vary with time. Further distortions occur because the transmitted signals are superimposed by noise or other disturbing signals. In order to recover the original data contents of the signal it is necessary for the received signal to be equalized.

In this context, for example, from the prior art described in European Patent Application EP-A-0 294 116, it is known that the originally transmitted data sequence is reconstructed by implementation of the so-called Viterbi algorithm. In a receiver the sample values are produced by a sampling of the received signal, which values are applied to a Viterbi decoder. At least one sample value can be assigned to each transmitted bit. Due to the dependence of a sample value on n previously sent bits the Viterbi decoder performs, by means of likelihood computations, an estimation of what binary value a transmitted bit must have had.

In addition, for example, European Patent Application EP-A-0 152 947 discloses a Viterbi decoder. Viterbi decoders are used as channel decoders in transmission systems, a channel encoder being arranged at the send end and a channel decoder at the receive end. In such transmission systems a bit string to be transmitted is converted prior to transmission into an encoded data sequence by means of an encoding method. To this end, a convolutional code is used for encoding purposes in the channel encoder, according to which code a plurality of data elements of the encoded data sequence are generated by means of different logic operations of the bit to be encoded and of the m bits preceding the bit to be encoded. With this encoding it is advantageously possible that, in the form of the intentionally produced redundancy of the encoded data sequence, the channel decoder can recover the bit string originally forming the basis of the encoded data sequence in a data sequence to be decoded of which several data elements were received incorrectly.

The Viterbi method is thus suitable both for equalizing the signals that have passed through a dispersive transmission channel, and for decoding encoded data sequences. The Viterbi method as such is described, for example, in the article entitled "The Viterbi Algorithm", by G. David Forney Jr., Proceedings of the IEEE, Vol. 61, No. 3, March 1973, pp. 268-278.

For a so-called Soft Decision Decoding reliability information for the data sequence to be decoded will be necessary for the data elements to be decoded of an encoded data sequence. The reliability information is a probability function indicating with what probability the data elements to be decoded correspond with the transmitted data elements.

In the above article it is outlined how reliability information can be procured by means of a Viterbi decoder. The reliability information produced thereby is reliability information averaged over a plurality of successive bits in a bit string. The reliability information is hereby formed from the optimal and from the sub-optimal, for example limited number of the best solutions. This instruction on the formation does not seem ideal.

SUMMARY OF THE INVENTION

It is an object of the present invention to provide a data transmission system of the type set forth in the opening paragraph, in which the equalizer generates in a most simple manner reliability information for each binary estimate.

This object is achieved in a transmission system of this type, in that from all possible paths whose n last state transitions corresponded with a binary value "one" and from all possible paths whose n last state transitions corresponded with a binary value "zero", always the path having the smaller probability function is selected and in that the binary value assigned to the smaller of the two selected values has the estimate $b_{i-n}$ and that reliability information $P(b_{i-n})$ for this estimate $(b_{i-n})$ is produced from the two selected probability functions.

This is advantageous in that the reliability information $P(b_i)$ is formed indeed for each individual estimated bit $b_i$. In addition, the reliability information $P(b_i)$ is produced from the probability values which correspond with the optimum case for $b_i=0$ and $b_i=1$. By means of the ratio between these two probability values it is then expressed how many times an estimate is more probable than the complementary value of this estimate.

A further object of the present invention is to provide a transmission system in which a large transmission reliability can be achieved.

In a transmission system of this type this object is achieved in that information signals $x_i$ to be transmitted are encoded by a convolution encoder into the bits $b_i$ at the transmitting end, and at the receiving end after the equalizer, a convolutional decoder is inserted processing the bits $b_i$ and the reliability information $P(b_i)$ assigned thereto in addition to equalized estimates.

When including the reliability information in the decoding, the residual error rate of the decoded bit string can thus be reduced considerably.

BRIEF DESCRIPTION OF THE DRAWING

The invention will be further described and explained with reference to the exemplary embodiment represented in the drawings, in which.

DETAILED DESCRIPTION OF THE PREFERRED EMBODIMENTS

Figure 1:
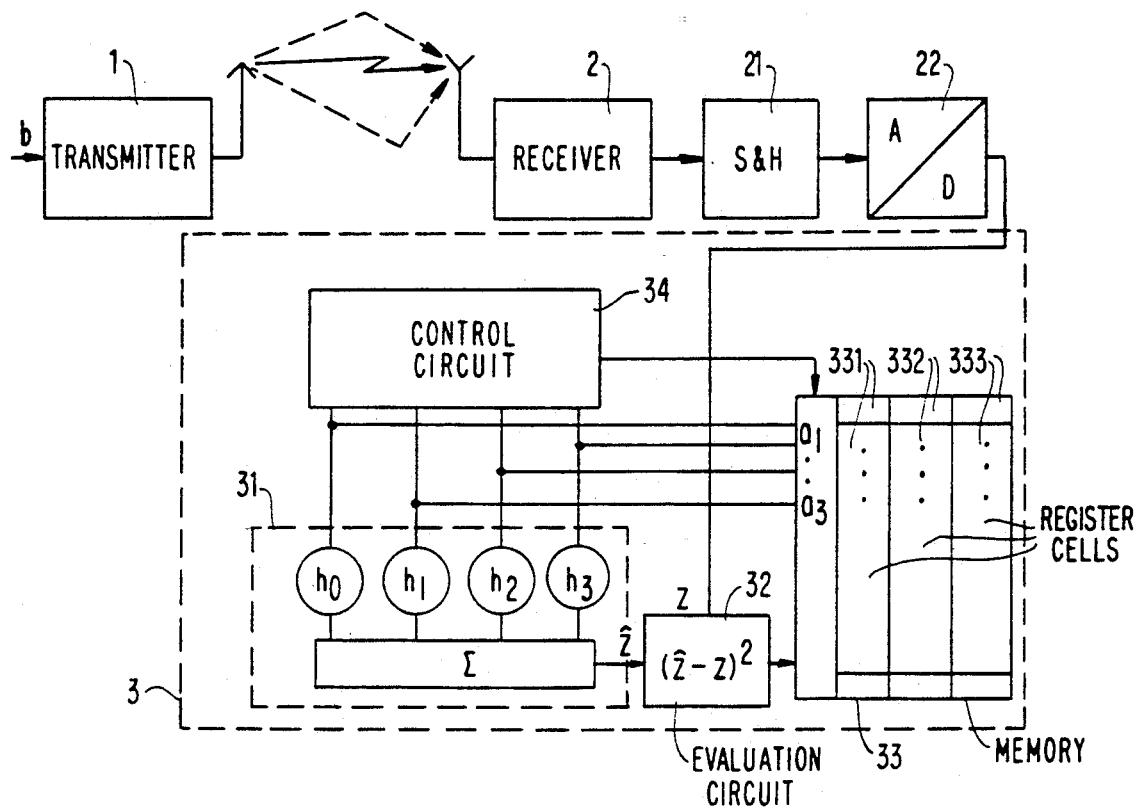
FIG. 1 shows a block diagram for producing reliability information.

FIG. 1 represents a radio transmission system in which the information signals to be transmitted are radiated in the form of bits $b_i$ over a transmitter 1. The signals r(t) received in a receiver 2 are applied to an equalizer. On the radio transmission link between the transmitter 1 and the receiver 2 the transmitted signal s(t) is distorted by means of multipath transmission as a result of reflections and superpositioning of noise and other disturbing signals.

In this manner a transmitted bit $b_i$ is superimposed by delayed signal portions of previously transmitted bits $b_{i-1}, b_{i-2}, \ldots b_{i-n}$. This superpositioning corresponds with a signal distortion. The signal received in response to a transmitted bit can no longer be unambiguously assigned to a low or high level. The influence of bits that have already been transmitted depends on the delay of the signal portions arriving with a delay at the receiver. After a specific period of time, depending on the characteristic of the transmission channel, the effect of an influence on a signal is no longer important and consequently, need no longer be taken into consideration with the equalization. The delay is advantageously stated as the number n of bits transmitted within this period of time.

As the received signal r(t) has an analog signal shape as a result of the superpositioning, which shape, without equalization, cannot be assigned to the binary value of the originally transmitted signal, the received signal r(t) is sampled by means of a sampling element 21 at equidistant instants. To further process the analog sample values, they are converted into digital sample values $z_i$ by means of an analog-to-digital converter 22 and then applied to the equalizer 3.

Figure 2:
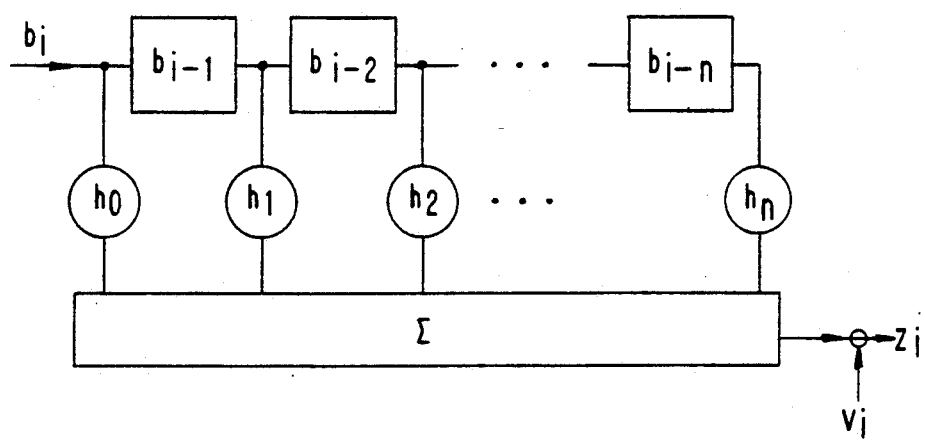
FIG. 2 shows a channel model of a dispersive transmission channel.

The equalization of the received signal r(t) is based on a channel model that describes by approximation the dispersive transmission channel by means of a linear finite transversal filter. FIG. 2 represents such a type of channel in which the transmission features of the transmission channel are reconstructed by means of filter coefficients $h_0 \ldots h_n$. During the transmission of bit $b_i$ and the n previous bits $b_{i-1} \ldots b_{i-n}$, the linear combination $b_i * h_0 + b_{i-1} * h_1 + \ldots b_{i-n} * h_n$ is formed and additionally superimposed by a noise signal $v_i$.

In the receiver it is tried especially with this type of channel to reconstruct the distortions occurring on the transmission path by implementing the intended linear combination by means of a transmission filter 31. The reconstruction of the transmission path is achieved by appropriately adjusting the filter coefficients $h_0, h_1, \ldots h_n$. The filter coefficients $h_0, h_1, \ldots h_n$ can be derived in this respect from the sample values of an estimated pulse reply of the transmission channel. For this purpose, for example a so-called training sequence may be used consisting of a bit string which is known to both the sender and the receiver. Each time the training sequence is received, the filter coefficients $h_0, h_1, \ldots h_n$ are adjusted such that after the transmission filter has been passed through, by comparing the distorted filter outputs with the samples of the received distorted signal, the known bit string having the lowest error rate is obtained. The circuit arrangement for forming the filter coefficients is not shown in the exemplary embodiment.

Figure 3:
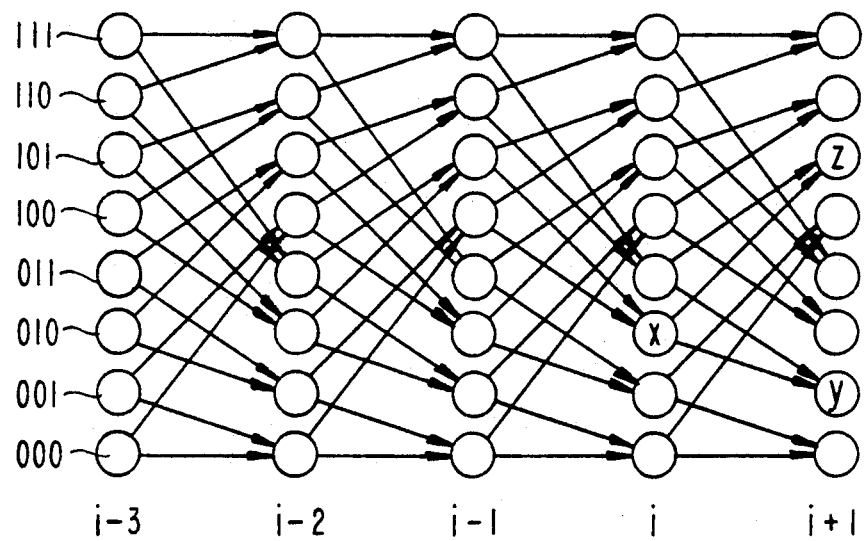
FIG. 3 shows a state diagram.

For the representation of the method implemented in the receiver, a state diagram with also the Viterbi method as usual is described below. The state diagram represented in FIG. 3 is a graph showing in a vertical direction columns of plotted pairs of $2^n$ nodes. Each node represents one of the combinations resulting from n bits. In this context n is the number of the oldest preceding bit, preceding a bit that has just been received, whose influence on the bit to be estimated is to be taken into account for the equalization. Each combination of these bits will be designated as a state in a sequence. In the state diagram several of these states have been represented in a horizontal direction. Each vertical column is assigned to a specific sampling instant $i-3, i-2, i-1, i, i+1$. The individual binary values 000...111 that can be assigned to a node are designated as its state. A state always corresponds with a possible assignment of the n last digital sample values received prior to an instant i in a bit string that may have been transmitted.

The same state is assigned to the nodes plotted in horizontal direction in the state diagram, the bit string assigned to these states being listed at to the left. The first binary value of a state, i.e. plotted leftmost, corresponds in this case with the binary value assigned to the last received sample value, the next binary value with the assignment of the sample value preceding this sample value etc. Thus, at instant i the first binary value corresponds with the estimate $b_i$ and the last binary value with the estimate $b_{i-n}$.

When a new sample value $z_i$ is received, the binary value 0 or the binary value 1 may be assigned thereto. By assigning the binary value 0 to the latest sample value a bit string 010 becomes the string 0010 and by assigning the binary value 1 to the latest sample value the string becomes 1010 respectively. Since each last sample value of this bit string does not have any influence on the equalization when a new sample value is received, this last binary value is omitted. From the state 010 the states 001 or 101 respectively are thus arrived at. As a result of the fact that a binary value 0 or 1 is assigned to the sample value, there are always only two transitions from all possible states to states in the right-hand row of states neighbouring the first one.

In the state diagram of FIG. 3 all transitions possible in this manner are indicated by arrows. For example, the two arrows from node x, whose state is assigned to the bit string 010 at the instant i, point to the node y for a transition to "zero", to which node the state 001 is assigned at the instant $i+1$ and, on the other hand, to the node z for a transition to "one", to which node the state 101 is assigned at the instant $i+1$.

For each transition from one node to the following node the probability is calculated with which this transition has taken place. By stringing together related transitions between nodes of adjacent vertical rows of nodes a path is realised. This path is equal to the reconstructed bit string $b_i, b_{i-1} \ldots b_{i-n}$. By multiplicative combination of the probabilities of individual transitions of a path the overall probability of the path will be produced.

For the computation of the probability of transition from one state to the next, the individual binary values of the bits $b_i \ldots b_{i-n}$ of one state are used as input parameters $c_i \ldots c_n$ of the transversal filter. The first input parameter $c_0$ always corresponds with the binary value of the transition, thus with the binary value assigned to the sample value just received. The output value of the transversal filter has in a first approximation, disregarding disturbances as a result of the noise signals $v_i$ etc. contained in the input signal, the value the sample value were to assume if the bit string $b_i, b_{i-1}, \ldots b_{i-n}$ used as an input parameter were transmitted and received over the radio transmission link. By comparing the output value $z_i$ with the actual sample value $z_i$ the bit string sent most probably can therefore be found.

A strong probability of transition from one state to a following state certainly does not provide sufficient guarantee for this transition to be correct. As a result of short-time disturbances or signal noise, a state transition that has actually not taken place may happen to seem the most probable transition. More correct estimates of the state transitions and thus the estimate of the binary value of the digital sample value that has just been received are achieved while taking into account the overall previous signal delay and considering the probability of all state transitions that lead to one of the $2^n$ states of the considered instant. For this purpose, each state may be assigned an overall probability function which is produced in accordance with a probability of a connection by a multiplicative combination of all individual probability functions of the state transitions that have let to this state.

So-called metrics are known to be used instead of simpler probability functions. The metric is then computed from the negative logarithm of each probability function. This is advantageous, among other things, in that for the computation of a connection probability for which the individual probability functions have to be multiplied, the metrics now only have to be added. For the formation of the metric in the exemplary embodiment the output value $z_i$ of the transversal filter 31 is to be subtracted from digital sample value $z_i$ in a signal evaluation circuit 32 and its value is raised to the power of two. In this manner a quadratic distance is produced. The smaller the quadratic distance the larger the probability is that the sample value of the bit string used as an input parameter is correct.

As a result of the linear combination of each n last bits an optimum estimate cannot be formed, however, until all n bits have been received. Therefore, the estimate $b_{i-n}$ is produced upon reception of the sample value $z_i$.

The estimate $b_i$ assigned to the sample value $z_i$ is assigned in time to the transitions from the states at the instant i to the states at the instant i+1.

For the formation of the estimate $b_{i-n}$, at a first step all transition probabilities from all states i to the states i+1 following in time are therefore calculated, where the transition of the binary value $b_{i-n}$ was assumed to be a transition to the binary value 0. The overall metric of the new states that can be realised in this manner is then provisionally computed from the overall metric of the relevant previous state L at the instant i and the metric of the transition from this previous state to the next state at the instant i+1.

Figure 4:
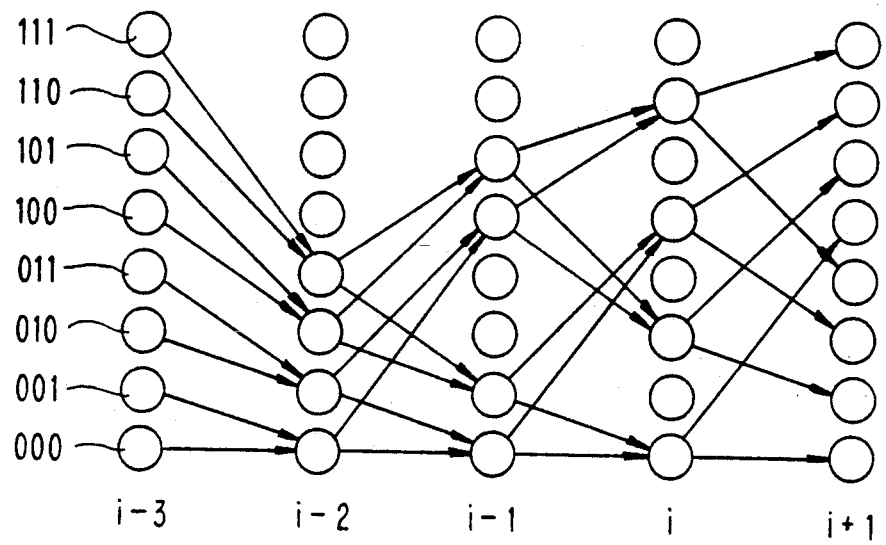
FIG. 4 shows a state diagram of all paths for which $b_{i-n}=0$.
Figure 5:
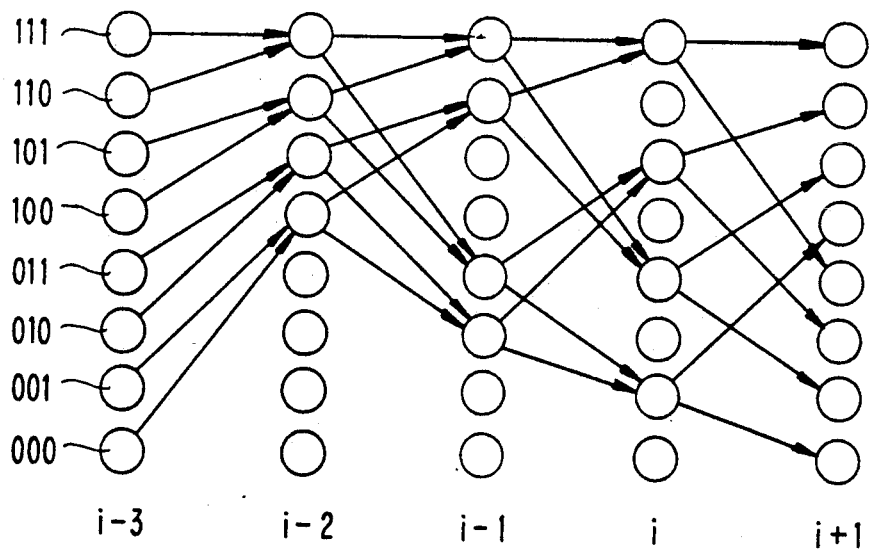
FIG. 5 shows a state diagram of all paths for which $b_{i-n}=1$.

At a second step the overall metric of the states at instant i+1 is computed in like manner, where the bits $b_{i-n}$ corresponded with a binary value 1; that is, a transition to "one". FIG. 4 represents the state diagram of FIG. 3 in which now only all paths have been entered where all transitions from instant i−n=1−3 to instant i+1−n=i−2 were transitions to "zero", that is to say, all transitions where the binary value 0 was assigned to bit $b_{i-3}$. On the other hand, FIG. 5 is a state diagram in which only the paths have been entered where the binary value 1 was assigned to the transitions from instant i−3 to instant i−2 for the bit $b_{i-3}$.

From all the overall metrics of the states that have resulted from a transition to "zero" and from all the overall metrics of the states that have resulted from a transition to "one", always the smallest overall metric is determined. This is to say, the path having the smallest overall metric is selected from the partial state diagram of FIG. 4 and from the partial state diagram of FIG. 5. These two paths are to be designated hereafter as a "zero" minimum path or a "one" minimum path; for example, the overall metrics are assigned to these paths as "zero" minimum overall metric and "one" minimum overall metric respectively.

The transition starting at instant i−n which is assigned to the smaller of these two selected minimum overall metrics then produces the estimate $b_{i-n}$ for the bit $b_{i-n}$ transmitted at the instant i−n.

Either one of these two selected minimum overall metrics represents the probability with which to each selected path represented by the state of each selected node in the most favourable case can be assigned the estimate $b_{i-n}=0$ or the estimate $b_{i-n}=1$. These probability values can be calculated back from the overall metrics. In the case of probability functions the individual probability functions would have been divided to provide reliability information stating how many times the selected estimate is more probable than its complementary value.

The use of metrics simplifies this calculation. By subtracting the "zero" minimum overall metric from the "one" minimum overall metric a probability function is obtained whose sign indicates the more probable estimate of the two. A positive sign then indicates that the binary value 1 as an estimate is more probable than the binary value 0. On the other hand, the absolute value forms the actual reliability information $P(b_{i-n})$.

At a last step the two newly produced overall probability functions available for one state may be compared with each other for each state and the smaller of the two values may be assigned to the state as a new overall probability function.

For implementing this method a row having $2^n$ memory locations in a memory module 33 is provided in the exemplary embodiment. The address of a memory location $a_n \ldots a_1$ in this case corresponds each time with one of the $2^n$ states. In first register cells 331 the overall metric assigned to a state is stored under the address of a memory location. When a memory location is activated, its address $a_n \ldots a_1$ is simultaneously passed to the transversal filter 31 by a control circuit 34 as an input parameter $c_i \ldots c_n$.

The control circuit once provides as a binary value 0 the first input parameter $C_0$ for each produced address. From the thus realised value $z_i$ of the transversal filter 31 and from the sample value $z_i$, the quadratic distance $1 = (z_i - z_i)^2$ is produced in the evaluation circuit. From this quadratic distance 1 and the overall metric L stored in first register cells 331 under the corresponding address, a new overall metric $L_0$ is produced which is stored in second register cells 332 under the appropriate address. In the same fashion the binary value 1 is assigned to the first input parameter $C_0$ and the overall metric $L_1$ realised in this fashion is stored in third register cells 333.

After the control circuit 34 has calculated all second and third register contents again by passing through all address combinations, the two smallest values are selected from all the new overall metrics $L_0$ of the second register cells 332 and from all the overall metrics $L_1$ of the third register cells 333. These two values are subtracted from each other. As described before, the sign provides the difference of the estimate $b_{i-n}$ and from the absolute value of the difference the desired reliability information $P(b_{i-n})$.

After the estimate has been determined, the relocation of the overall metrics stored in the second and third registers 332, 333 is now effected for the new states. For this purpose, the control circuit first generates the addresses 000 and 001. From the states 000 and 001 the state 000 each time arises, as described hereinbefore, as a result of a "zero" transition. The contents of the second register cells 332 of the addresses 000 and 001 exactly correspond with a "zero" transition of these two states to the state 000. The contents of these two activated second register cells 332 are compared with each other for this purpose and the smaller of the two values is recorded as the new contents of the first register cells 331 under the address 000. The contents of the third register cells 333 under the addresses 000 and 001 correspond with a "one" transition to the state 100. The contents of these two third register cells are thus also compared with each other and the smaller of the two overall metrics stored in these register cells is stored as a new overall metric under the address 100 in the first register cell 331.

By accordingly activating the remaining register cells and comparing adjacent register cells with each other, the new overall metric of a new state is determined and recorded under the first register cell address assigned to the new state. In this manner the new overall metrics are written into all first register cells. Subsequently, the arrival of a new sample value $z_{i+1}$ is awaited and the associated estimate $b_{i+1-n}$ is formed in the manner described above.

In an improved embodiment of the invention the reliability information $P(b_{i-n})$ takes account of the noise power v estimated at the instant at which the signal is received. This taking account of the noise is based on the understanding that higher noise powers imply greater uncertainty for the estimation and can be carried out such that the reliability information is divided by the amount of the estimated noise power v. The estimation of the noise power is performed in this case by implementing prior-art methods.

Of specific advantage is processing the reliability information, which has taken account of the noise power, for transmission systems in which time-consecutive data elements are interleaved such that adjacent data elements are transmitted in a time-shifted manner. Since also the noise power is a time-dependent function, originally time-adjacent data elements are disturbed at different degrees by the noise power as a result of the different transmission instants. When the signals are de-leaved prefereably the data elements that have been disturbed less strongly can then be relied on upon. With the reliability information to which a value has been assigned, there is the possibility with respect to the processing of the data elements to use preferably those data elements that provide an optimum security against erroneous estimation.

Figure 6:
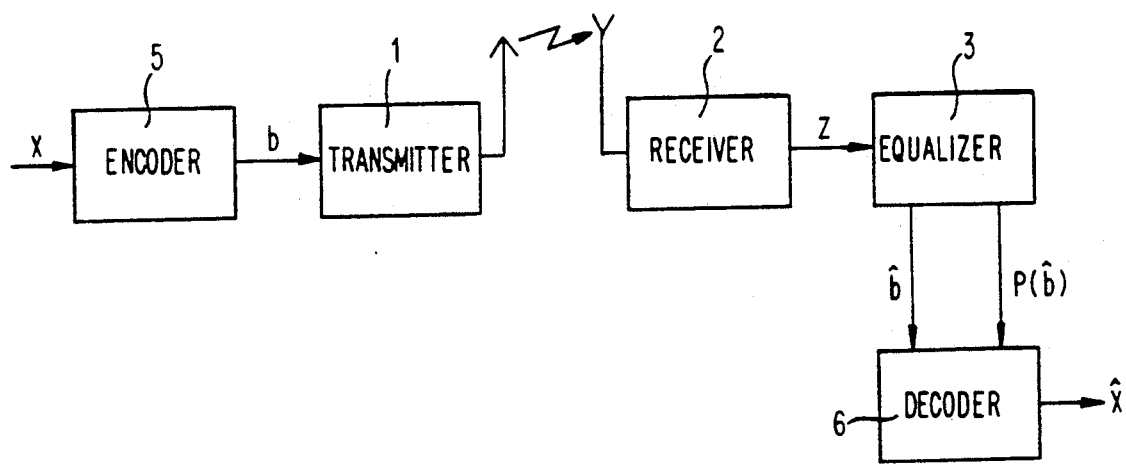
FIG. 6 shows a block diagram of a digital transmission system having a low residual error rate.

FIG. 6 represents, as a further exemplary embodiment of the invention, a digital transmission system in which information signals $x_k, x_{k+1} \ldots$ to be transmitted are first applied to a convolution encoder 5. The convolution encoder 5 converts the input bit string $x_k, x_{k+1}, \ldots$ into a redundant data sequence of the bits $b_i, b_{i-1}, \ldots$, which are then transmitted through a dispersive transmission channel in a manner described hereinbefore. At the receiver 3 the signal received in the form of sample values $z_i, z_{i+1}, \ldots$ is equalized by the equalizer 3 in the manner already described. The estimates $b_i, b_{i+1}, \ldots$ produced during the equalization, as well as the associated reliability information signal $P(b_i), P(b_{i-1}), \ldots$ are applied to a decoder 6. In the decoder 6 the estimated bit string $b_i, b_{i+1}, \ldots$ is decoded into a string $x_k, x_{k+1}, \ldots$ In the exemplary embodiment a Viterbi decoder is used for the decoding.

With the known Viterbi decoding the received encoded signal sequence is each time compared with all valid code sequences the encoder 5 might have generated. It is known to use the number of bits by which the equalized data sequence distinguishes itself from the individual code elements of the set of codes as a metric for the Viterbi decoder. By multiplying a metric obtained in this manner or multiplying a metric obtained in a different manner by the reliability information $P(b_i)$ an estimate of a data sequence to be decoded is obtained. In this manner the probability is enhanced that during the decoding the sent data sequence will really be recovered, whereas the decoder thus far not only uses the signal redundancy for the decoding, but also receives information, which individual bits of the data sequence to be decoded are more reliable and which are less reliable.

I claim:

1. A receiver for a digital transmission system comprising:

means for receiving an information signal which has been transmitted in digital form over a transmission channel, said receiver having an analog signal output z(t) which includes any intersymbol interference resulting from dispersion in said channel, analog to digital conversion means for converting said analog signal output into a sequence of sample values ($z_k, z_{k-1}, z_{k-2}, \ldots$), and an equalizer for producing binary estimates ($b_k, b_{k-1}, b_{k-2}, \ldots$) from said sequence of sample values, and reliability information for at least two of said estimates, said equalizer comprising means for generating $2^n$ estimates, each formed by a bit $b_i$ and n bits immediately preceding this bit; means for evaluating, for each of said estimates, the probability that said sequence of sample values represents the respective transitions from one state to a following state that correspond to said estimate, and producing a probability function for each of said estimates; means for selecting two estimates having the smallest probability function, the first being that the most recent transition is to a binary "one", and the second being that the most recent transition is to a binary "zero"; and means for producing reliability information ($P(b_{i-n})$) from the two selected estimates.

2. A receiver as claimed in claim 1, characterized in that said probability function for each of said estimates is determined from a quadratic comparison of the probability of transition between two states, and an overall probability function is determined by adding the probability functions of the successive transitions.

3. Digital transmission receiver as claimed in claim 2, characterised in that information to be transmitted ($x_i$) is encoded into bits ($b_i$) at the transmit end by a convolution encoder and in that at the receive end after the equalizer a convolution decoder is inserted processing also the bits ($b_i$) and the reliability information ($P(b_i)$) assigned thereto, in addition to equalized estimates.

4. Digital transmission receiver as claimed in claim 3, characterised in that the convolution decoder operates according to the Viterbi method and regards the reliability information ($P(b_i)$) as a metric.

5. Digital transmission receiver as claimed in claim 2, characterised in that the overall probability function ($L_0$) of the n last state transition corresponding with the binary value "zero" is subtracted from the overall number of the n last state transition to a binary value "one" and in that the sign of the difference produces the estimate ($b_{i-n}$) and the absolute value of the difference produces the reliability information ($P(b_{i-n})$) assigned to the estimate ($b_{i-n}$).

6. Digital transmission receiver as claimed in claim 2, characterised in that the reliability information ($P(b_{i-n})$) is corrected by means of a magnitude depending on an average noise power ($V_{i-n}$).

7. A receiver as claimed in claim 1, characterized in that said reliability information is determined from the ratio between the probability functions of said two estimates.

8. A receiver for a digital transmission system comprising:
  means for receiving an information signal which has been transmitted in digital form over a transmission channel, said receiver having an analog signal output z(t) which includes any intersymbol interference resulting from dispersion in said channel,
  analog to digital conversion means for converting said analog signal output into a sequence of sample values ($z_k$, $z_{k-1}$, $z_{k-2}$, ... ), and
  an equalizer for producing binary estimates ($b_k$, $b_{k-1}$, $b_{k-2}$, ... ) from said sequence of sample values, and reliability information for at least two of said estimates,
  said equalizer comprising means for generating $2^n$ estimates, each formed by a bit $b_i$ and n bits immediately preceding this bit; and means for evaluating, for each of said estimates, the probability that said sequence of sample values represents the respective transitions from one state to a following state that correspond to said estimate, and producing a probability function for each of said estimates,
  said means for evaluating comprising a memory having a plurality of sets of register cells, each register cell of a set corresponding to an estimate defined as a unique state sequence and storing therein a probability function that said sequence equals the respective portion of said information signal; a linear finite transversal filter for producing, for each estimate, an output signal containing intersymbol interference; means for comparing values of said output signal with corresponding values from said sequence of sample values; and control means for selecting register cells for comparison.

9. A receiver as claimed in claim 8, characterized in that said probability function is the negative logarithm of the probability of each respective transition.

* * * * *